United States Patent
Kutney et al.

(10) Patent No.: US 8,382,939 B2
(45) Date of Patent: Feb. 26, 2013

(54) PLASMA PROCESSING CHAMBER WITH ENHANCED GAS DELIVERY

(75) Inventors: Michael Charles Kutney, Santa Clara, CA (US); Roger Alan Lindley, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 854 days.

(21) Appl. No.: 12/501,885

(22) Filed: Jul. 13, 2009

(65) Prior Publication Data

US 2011/0006038 A1   Jan. 13, 2011

(51) Int. Cl.
| | | |
|---|---|---|
| C23C 16/455 | (2006.01) | |
| C23F 1/00 | (2006.01) | |
| H01L 21/306 | (2006.01) | |
| C23C 16/06 | (2006.01) | |
| C23C 16/22 | (2006.01) | |
| C23C 16/50 | (2006.01) | |
| C23C 16/503 | (2006.01) | |
| C23C 16/505 | (2006.01) | |
| C23C 16/509 | (2006.01) | |

(52) U.S. Cl. .................. 156/345.34; 118/728; 118/715; 118/723 E; 118/723 ER; 118/50; 156/345.29; 156/345.33; 156/345.43; 156/345.44; 156/345.45; 156/345.46; 156/345.47

(58) Field of Classification Search .................. 118/715, 118/728, 50, 723 E, 723 ER; 156/345.29, 156/345.33, 345.34, 345.43–47
See application file for complete search history.

(56) References Cited

U.S. PATENT DOCUMENTS

| | | | | |
|---|---|---|---|---|
| 5,229,081 A | * | 7/1993 | Suda | 422/186 |
| 5,284,519 A | * | 2/1994 | Gadgil | 118/719 |
| 5,951,771 A | * | 9/1999 | Raney et al. | 118/723 ER |
| 6,294,026 B1 | | 9/2001 | Roithner et al. | |
| 6,428,847 B1 | * | 8/2002 | Grant et al. | 427/248.1 |
| 6,432,259 B1 | * | 8/2002 | Noorbakhsh et al. | 156/345.33 |
| 6,495,233 B1 | * | 12/2002 | Shmurun et al. | 428/64.1 |
| 6,528,751 B1 | | 3/2003 | Hoffman et al. | |
| 6,678,304 B2 | * | 1/2004 | Morishige | 372/55 |
| 2002/0108933 A1 | | 8/2002 | Hoffman et al. | |
| 2003/0062344 A1 | | 4/2003 | Hoffman et al. | |
| 2003/0136766 A1 | | 7/2003 | Hoffman et al. | |
| 2003/0218427 A1 | | 11/2003 | Hoffman et al. | |
| 2004/0056602 A1 | | 3/2004 | Yang et al. | |
| 2004/0149699 A1 | | 8/2004 | Hofman et al. | |
| 2004/0159287 A1 | | 8/2004 | Hoffman et al. | |
| 2004/0211759 A1 | | 10/2004 | Hoffman et al. | |
| 2005/0001556 A1 | | 1/2005 | Hoffman et al. | |

(Continued)

FOREIGN PATENT DOCUMENTS

JP   2004119987 A   4/2004

OTHER PUBLICATIONS

PCT international search report and written opinion of PCT/US2010/041729 dated Mar. 2, 2011.

*Primary Examiner* — Rudy Zervigon

(74) *Attorney, Agent, or Firm* — Patterson & Sheridan, LLP

(57) ABSTRACT

A method and apparatus for providing flow into a processing chamber are provided. In one embodiment, a vacuum processing chamber is provided that includes a substrate support pedestal disposed in an interior volume of a chamber body, a lid enclosing the interior volume, a gas distribution plate positioned below the lid and above the substrate support pedestal, and a vortex inducing gas inlet oriented to induce a vortex of gas circulating in a plenum around a center line of the chamber body prior to the gas passing through the gas distribution plate.

12 Claims, 10 Drawing Sheets

U.S. PATENT DOCUMENTS

| | | |
|---|---|---|
| 2005/0167051 A1 | 8/2005 | Hoffman et al. |
| 2005/0178748 A1 | 8/2005 | Buchberger et al. |
| 2005/0236377 A1 | 10/2005 | Hoffman et al. |
| 2006/0157201 A1 | 7/2006 | Hoffman et al. |
| 2007/0251920 A1 | 11/2007 | Hoffman |
| 2008/0023143 A1 | 1/2008 | Hoffman et al. |
| 2008/0230518 A1 | 9/2008 | Brillhart et al. |
| 2009/0061640 A1 | 3/2009 | Wong et al. |
| 2011/0006038 A1* | 1/2011 | Kutney et al. .................... 216/58 |
| 2012/0000422 A1* | 1/2012 | Lam et al. ...................... 118/715 |

* cited by examiner

PLASMA PROCESSING CHAMBER WITH ENHANCED GAS DELIVERY

BACKGROUND

1. Field of the Invention

Embodiments of the present invention relate to a plasma processing system. More particularly, embodiments of the invention relate to a plasma processing chamber that induces a circulating flow of gases just prior to distributing the gases through a showerhead.

2. Background of the Related Art

Integrated circuits have evolved into complex devices that can include millions of components (e.g., transistors, capacitors, resistors, and the like) on a single chip. The evolution of chip designs continually requires faster circuitry and greater circuit density. The demands for greater circuit density necessitate a reduction in the dimensions of the integrated circuit components. The minimal dimensions of features of such devices are commonly referred to in the art as critical dimensions. The critical dimensions generally include the minimal widths of the features, such as lines, columns, openings, spaces between the lines, and the like.

As these critical dimensions shrink, process uniformity across the substrate becomes paramount to maintain high yields. One problem associated with a conventional plasma etch process used in the manufacture of integrated circuits is the non-uniformity of the etch rate across the substrate, which may be due, in part, to a lateral offset between the reactive species and the substrate being etched. One factor contributing to the tendency of the reactive species to be offset from the center of the substrate is inability for completely eliminate skew or azimuthal non-uniformity of gases provide to the processing chamber through a gas distribution plate. As gases may exit the gas distribution plate preferentially to one area of the chamber relative to another, the reactive (or other) species may become concentrated or starved in those areas, causing an offset, skew or azimuthal non-uniformity of processing results. This offset contributes to a loss of etch uniformity over the surface of the substrate which may significantly affect performance and increase the cost of fabricating integrated circuits.

Thus, as linewidths and critical dimensions continue to shrink, the need remains for a continued improvement in process uniformity in order to enable fabrication of next generation devices at a practical cost of manufacture. Therefore, there is a need in the art for an improved method and apparatus for etching material layers during the manufacture of integrated circuits.

SUMMARY

A method and apparatus for providing flow into a processing chamber are provided. In one embodiment, a vacuum processing chamber is provided that includes a substrate support pedestal disposed in an interior volume of a chamber body, a lid enclosing the interior volume, a gas distribution plate positioned below the lid and above the substrate support pedestal, and a vortex inducing gas inlet oriented to induce a vortex of gas circulating in a plenum around a center line of the chamber body prior to the gas passing through the gas distribution plate.

In another embodiment, a vacuum processing chamber is provided that includes a substrate support pedestal disposed in an interior volume of a chamber body, a lid enclosing the interior volume, a gas distribution plate positioned below the lid and above the substrate support pedestal, a plenum defined between the gas distribution plate and the lid, and a vortex inducing gas inlet oriented to induce a vortex of gas circulating in the plenum prior to the gas passing through the gas distribution plate.

In yet another embodiment, a vacuum processing chamber is provided that includes a substrate support pedestal disposed in an interior volume of a chamber body, a lid enclosing the interior volume, a gas distribution plate positioned below the lid and above the substrate support pedestal, a plenum defined between the gas distribution plate and the lid, and a vortex inducing gas inlet oriented to induce a vortex of gas circulating in the plenum prior to the gas passing through the gas distribution plate. The gas distribution plate includes a partition defining a second plenum between the lid and the gas distribution plate, the second plenum fluidly communicating with a second gas inlet formed in the lid and the interior volume of the processing chamber.

In another embodiment, a method for enhancing gas delivery in a plasma processing chamber is provide that includes forming a vortex of gas upstream of a gas delivery plate, creating a radial pressure gradient in a plenum defined adjacent the gas delivery plate from the gas from the vortex, and flowing the gas from the plenum into an interior volume of the processing chamber.

BRIEF DESCRIPTION OF THE DRAWINGS

So that the manner in which the above recited features of embodiments of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

It is also contemplated that features of one embodiment may be beneficially utilized in other embodiments without further recitation.

DETAILED DESCRIPTION

Embodiments of the present invention generally relate to a method and apparatus for improving process uniformity across a semiconductor substrate in a processing chamber which utilizes a showerhead, also known as a gas distribution plate, for introducing gases into the chamber. Those skilled in the art will understand that other forms of plasma etch chambers may be used to practice the invention, including reactive ion etch (RIE) chambers, electron cyclotron resonance (ECR) chambers, and the like. Furthermore, embodiments of the present invention may be useful in any processing chamber where flow control may improve process uniformity across the surface of a substrate during processing, such as atomic layer deposition (ALD) chambers, chemical vapor deposition (CVD) chambers, plasma enhanced chemical vapor deposition (PECVD) chambers, magnetically enhanced plasma processing chambers, and the like.

Figure 1:
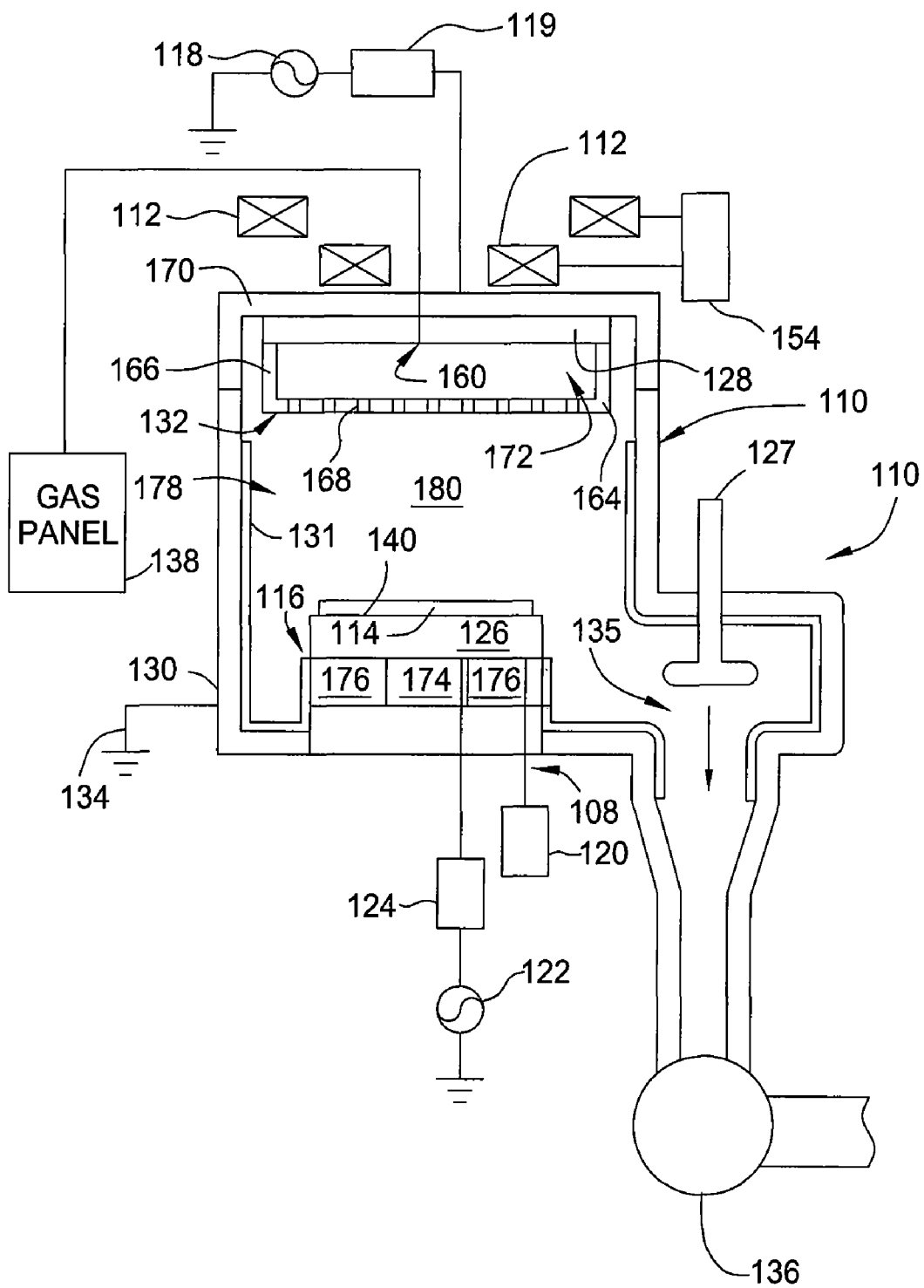
FIG. 1 is a schematic sectional view of one embodiment of a processing chamber having at least one vortex inducing gas inlet.

FIG. 1 depicts a schematic, cross-sectional diagram of vacuum processing chamber 102 having at least one vortex inducing gas (VIG) inlet 160 positioned prior to a gas distribution plate 132. The VIG inlet 160 is utilized to form a vortex circulating around a centerline of the processing chamber 102 prior to passing through the gas distribution plate 132. In the embodiment illustrated in FIG. 1, VIG inlet 160 is formed in a lid 170 of the processing chamber 102 and creates a radial distribution (i.e., a gradient) of flow and/or pressure upstream of the gas distribution plate 132, which results in a radial distribution of pressure and/or flow rate of gases entering a processing region 180 of the processing chamber 102. Since processing results that are radially non-uniform easier to compensate for by using other process control variables, substrate processing results may be tailored with greater precision as to substantially reduce, if not eliminate, skew or azimuthal non-uniformity. Examples of process control parameters that are suitable for controlling edge to center processing results which can be utilized to compensate for the radial distribution of gas flow rate and/or pressure due to the vortex inducing nozzle include plasma density and substrate temperature gradients, control of electrical and magnetic fields, among others. In another embodiment, the gas distribution plate 132 may be used to create an asymmetrical processing result. One example of a processing chamber in which the invention may be beneficially utilized is an ENABLER™ processing chamber available from Applied Materials, Inc., of Santa Clara, Calif. It is also contemplated that the invention may be used to advantage in other processing chambers, including those from other manufacturers.

In one embodiment, a processing chamber 102 comprises a vacuum chamber body 110 having a conductive chamber wall 130 and bottom 108. The chamber wall 130 is connected to an electrical ground 134. The lid 170 is disposed on the chamber wall 130 to enclose an interior volume 178 defined within the chamber body 110. At least one solenoid segment 112 is positioned exterior to the chamber wall 130. The solenoid segment(s) 112 may be selectively energized by a DC power source 154 that is capable of producing at least 5V to provide a control knob for plasma processes formed within the processing chamber 102.

A ceramic liner 131 is disposed within the interior volume 178 to facilitate cleaning of the chamber 102. The byproducts and residue of the etch process may be readily removed from the liner 131 at selected intervals.

A substrate support pedestal 116 is disposed on the bottom 108 of the process chamber 102 below the gas distribution plate 132. A processing region 180 is defined within the interior volume 178 between the substrate support pedestal 116 and the gas distribution plate 132. The substrate support pedestal 116 may include an electrostatic chuck 126 for concentrically retaining a substrate 114 on a surface 140 of the support pedestal 116 during processing. The electrostatic chuck 126 is controlled by a DC power supply 120.

The support pedestal 116 may be coupled to an RF bias source 122 through a matching network 124. The RF bias source 122 is generally capable of producing an RF signal having a tunable frequency of 50 kHz to 60 MHz and a power of between 0 and 12,000 Watts. Optionally, the RF bias source 122 may be a DC or pulsed DC source.

The support pedestal 116 may also include inner and outer temperature regulating zones 174, 176. Each temperature regulating zone 174, 176 may include at least one temperature regulating device, such as a resistive heater or a conduit for circulating coolant, so that the radial temperature gradient of the substrate disposed on the pedestal may be controlled. An example of one suitable pedestal with inner and outer temperature regulating zones is described in U.S. patent application Ser. Nos. 10/960,874 and 11/531,474, which are incorporated by reference in their entireties.

The interior of the chamber 102 is a high vacuum vessel that is coupled to a vacuum pump 136 through an exhaust port 135 formed through the chamber wall 130 and/or chamber bottom 108. A throttle valve 127 disposed in the exhaust port 135 is used in conjunction with the vacuum pump 136 to control the pressure inside the processing chamber 102. The position of the exhaust port 135 and other flow restrictions within the interior volume 178 of the chamber body 110 influence the conductance and gas flow distribution within the processing chamber 102.

The gas distribution plate 132 provides a conduit through which at least one process gas is introduced into the processing region 180 in an asymmetrical manner that may be utilized to tune the conductance and gas flow distribution described above that are caused by the other chamber components (e.g., location of the exhaust port, geometry of the substrate support pedestal or other chamber component) so that the flow of gases and species are delivered to the substrate in a uniform, or selected, distribution.

In an embodiment such as the one depicted in FIG. 1, the gas distribution plate 132 includes a mounting plate 128 coupled to a face plate 164 by an annular outer wall 166. A cylindrical plenum 172 is defined between the face plate 164 and the lid 170. The plenum 172 may alternatively have other geometries. The VIG inlet 160 provides gas to the plenum 172 from one or more gas panels 138. The flow of gas through the one or more VIG inlets 160 may be independently controlled. Although only one VIG inlet 160 is shown coupled to a single gas panel 138, it is contemplated that the one or more VIG inlets 160 may be coupled to one or more shared and/or separate gas sources. Gases provided from the gas panel 138 delivered into the plenum 172 defined between the lid 170 and face plate 164 enter the processing region 180 through a plurality of holes 168 formed through the face plate 164.

The mounting plate 128 is coupled to the lid 170 opposite the support pedestal 116. The mounting plate 128 is fabricated from or covered by an RF conductive material. The mounting plate 128 is coupled to an RF source 118 through an impedance transformer 119 (e.g., a quarter wavelength matching stub). The RF source 118 is generally capable of producing an RF signal having a tunable frequency of about 162 MHz and a power between about 0 and 2000 Watts. The mounting plate 128 and/or face plate 164 is powered by the RF source 118 to maintain a plasma formed from the process gas present in the processing region 180 of the processing chamber 102.

Figure 2:
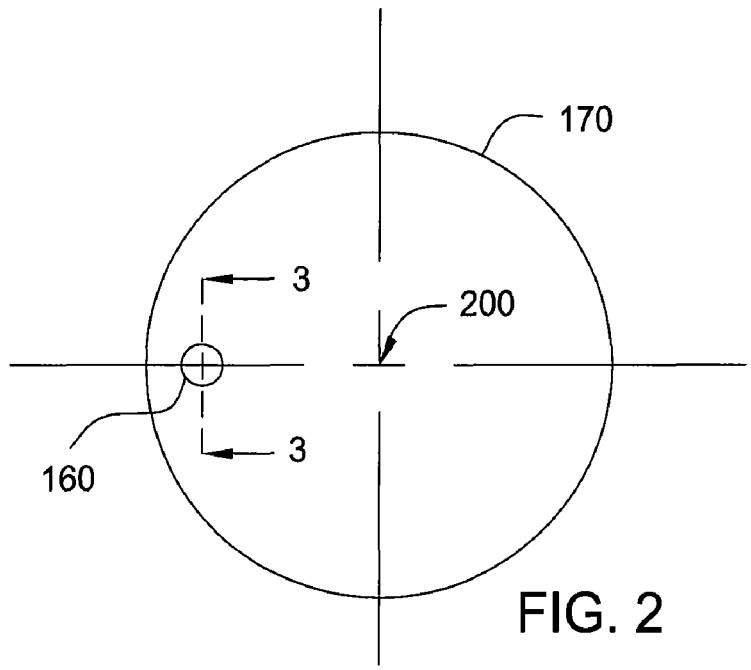
FIG. 2 is a top view of one embodiment of the gas diffuser of FIG. 1.
Figure 3:
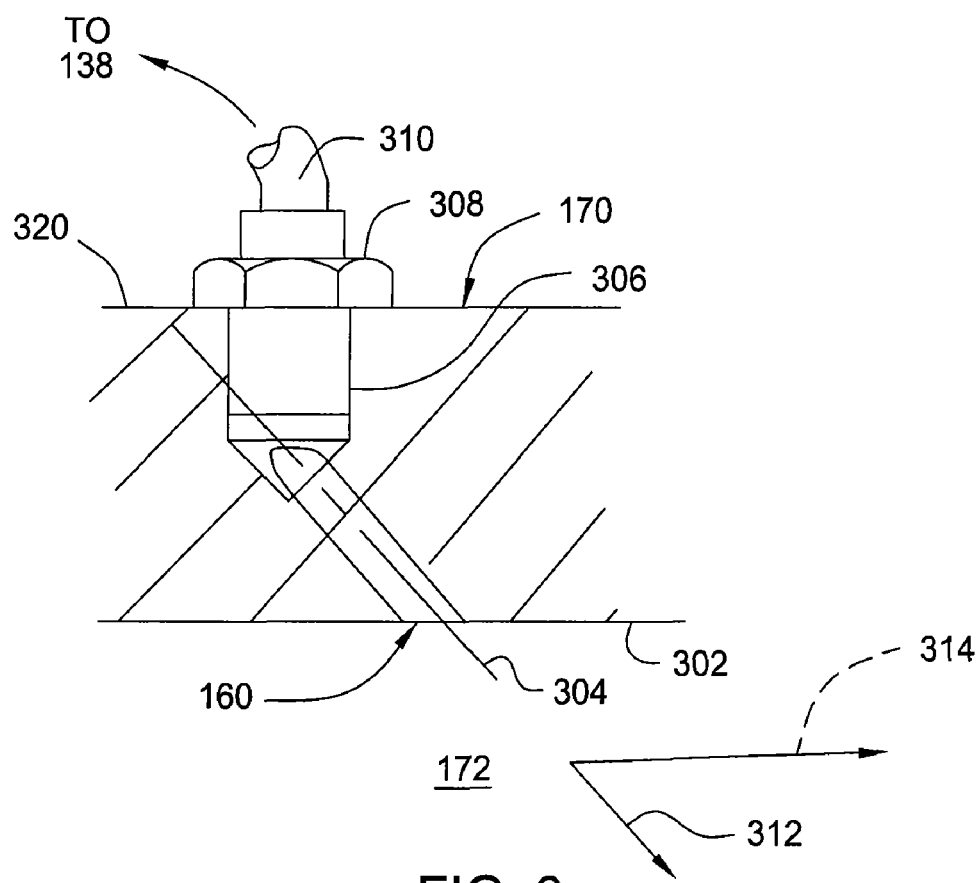
FIG. 3 is a partial sectional view of one embodiment of a vortex inducing gas inlet formed though a lid of the processing chamber of FIG. 1.

FIGS. 2-3 are top views and partial sectional views of the lid 170 illustrating the orientation of the VIG inlet 160. The VIG inlet 160 is formed in a bottom surface 302 of the lid 170 and is coupled to a port 306 formed on the top 320 of the lid 170. The port 306 is configured to accept a fitting 308 that facilitates coupling to the gas panel 138 via a conduit 310. Gas is delivered from the gas panel 138 via a conduit 310 and fitting 308 through the VIG inlet 160 into the plenum 172.

The VIG inlet 160 has a center line 302 that is orientated sufficiently tangential relative to a radius originating at the center line 200 of the processing chamber 102. The tangential component of the orientation of center line 302 causes flow exiting the VIG inlet 160 (shown by arrow 304) to have a tangential component sufficient to induce a circulating flow (e.g., a vortex) within the plenum 172, as indicated by arrow 314.

The circulating vortex flow within the plenum creates a high pressure region proximate the outer edge of the gas distribution plate 132 and a low pressure region proximate the center of the gas distribution plate 132. The pressure differential within the plenum 172 caused by the circulating flow results in a radial pressure and/or flow gradient having little or no skew or azimuthal non-uniformity, which can be readily tuned using other processing parameters.

Figure 4:
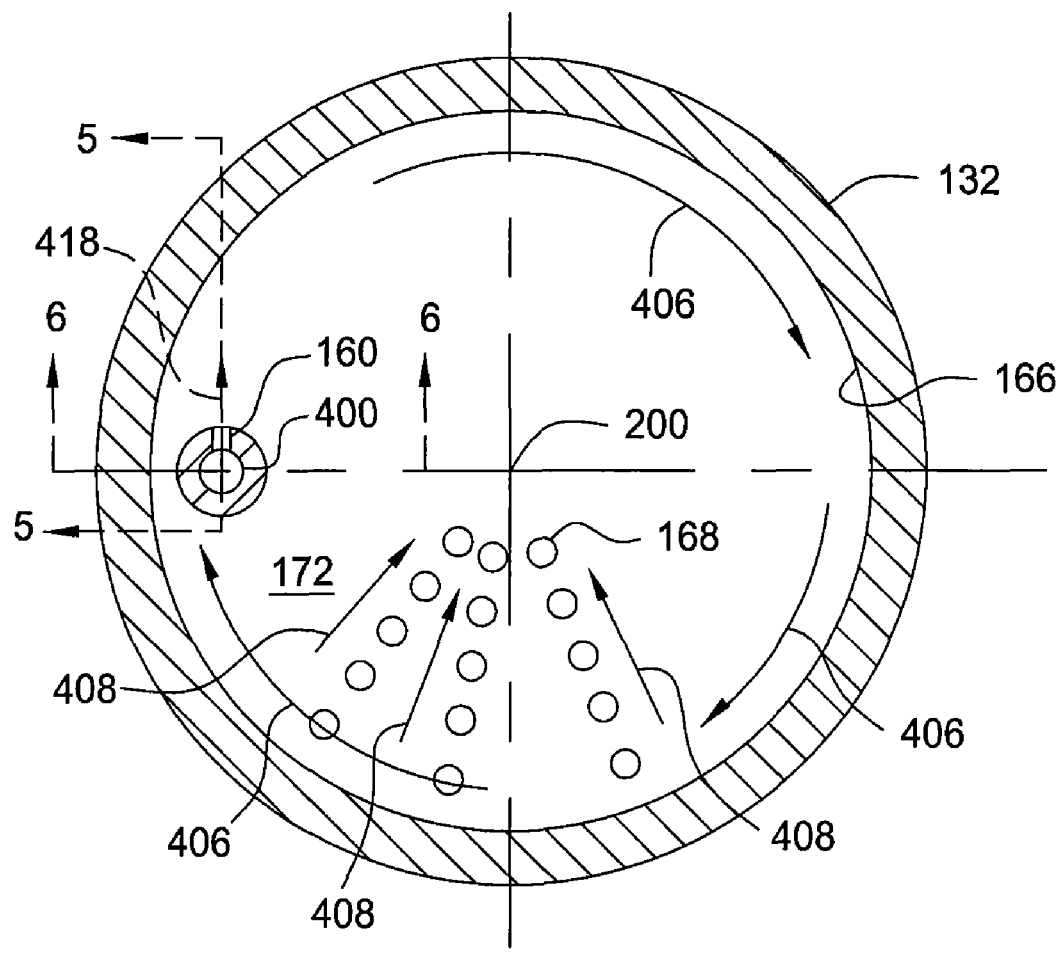
FIG. 4 is a sectional view of another embodiment of vortex inducing gas inlet embodied in a nozzle.
Figure 5:
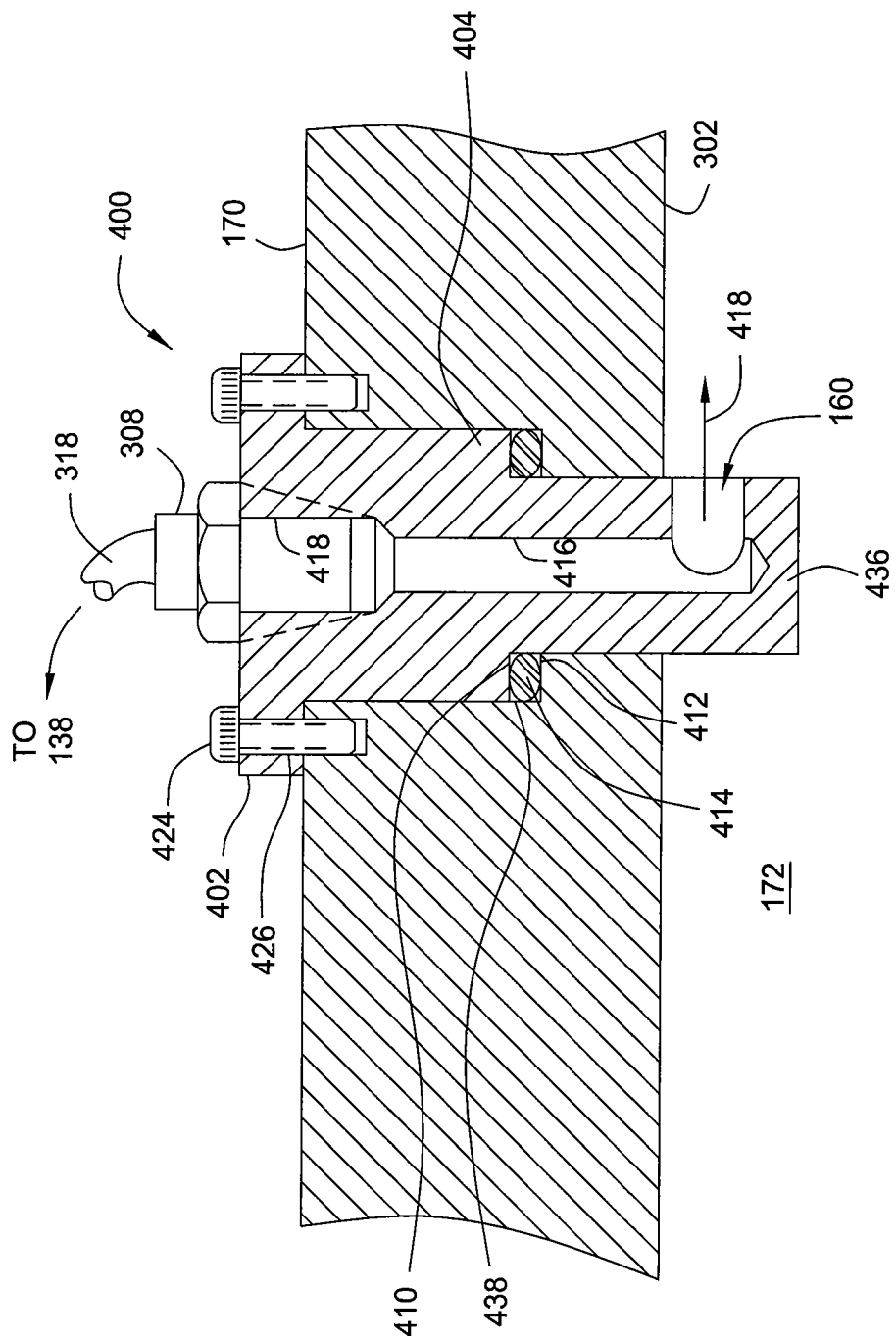
FIG. 5 is sectional view of the nozzle of FIG. 4 taken along section ling 5-5 of FIG. 4.
Figure 6:
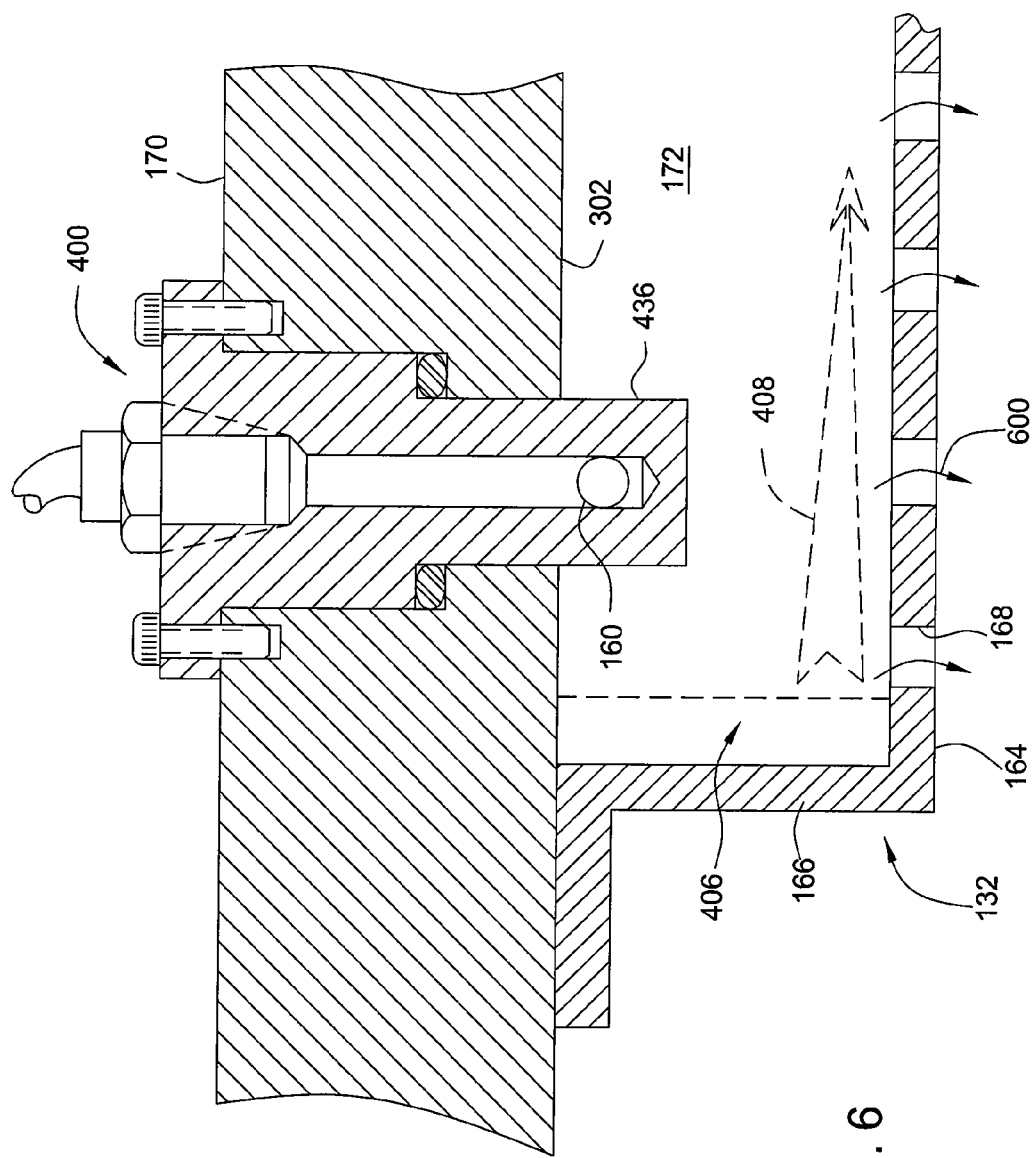
FIG. 6 is sectional view of the nozzle of FIG. 4 taken along section ling 6-6 of FIG. 4 taken along section ling 3-3 of FIG. 2.

FIGS. 4-6 are partial sectional views of another embodiment of a VIG inlet 160 embodied in a nozzle 400. FIG. 5 is a sectional view of the nozzle 400 taken along section line 5-5 of FIG. 4, while FIG. 6 is a sectional view of the nozzle 400 taken along section line 6-6 of FIG. 4. The nozzle 400 has an orientation which directs a flow of gas exiting the VIG inlet 160 in a direction substantially tangential 418 to a radius originating from the center line 200 of the chamber 102, thus inducing a vortex flow 406 within the plenum 172. The fastest portion of the vortex-moving gas flow 406 resides proximate the annular outer wall 166 of the gas distribution plate 132. As portions of the vortex-moving gas flow 406 slows, the slowing portion of the gas moves radially inward, as illustrated by arrows 408. The flow 408 moving radially inward then passes through the holes 168 in the gas distribution plate 132 into the processing region 180. Since the flow 406 acts as an annular band or ring of homogenous pressure, the pressure of the flow 408 originating therefrom is independent on the angular origination of the flow 408 relative to the center line 300 of the chamber body 102. Accordingly, the pressure and/or flow passing through holes 168 residing on a common bolt circle vary only radially. The vortex flow acts to removal substantially reduce, if not eliminate, skew or azimuthal non-uniformity of pressure of gases within the plenum 172, while inducing a pressure gradient, which is in this example a high edge to low center pressure gradient. The pressure gradient within the plenum 172 results in a radial gradient of flow and/or pressure of gases passing through the gas distribution plate 132 into the processing region.

The nozzle 400 generally includes a mounting flange 402 extending from a cylindrical main body 404. The main body 404 is configured to mate with a stepped hole 438 formed in the lid 170. A cylinder 436 extends from a bottom 410 of the main body 404. The depth of the stepped hole 438 and the length of the cylinder 436 is selected such that the VIG inlet 160 is positioned below the bottom surface 302 of the lid 170. An o-ring 414 or other seal may be disposed between the bottom 410 of the main body 404 and a bottom 412 of the stepped hole 438 to provide a seal between the nozzle 400 and the lid 170, thus preventing leakage. The o-ring 414 is compressed by fasteners 424 passing through the mounting flange 402 and threading into the lid 170 to urge the nozzle 400 against the bottom 412 of the stepped hole 438. The holes 426 in the mounting flange 402 accepting the fasteners 424 may have a pattern which orientates the nozzle 400 within the stepped hole 438 to insure a substantial tangential orientation of the VIG inlet 160 such that the vortex flow 406 is produced in the plenum 172. Alternatively, the nozzle 400 may be keyed or otherwise secured in a predefined orientation in the lid 170 which insures a substantial tangential orientation of the VIG inlet 160 by other suitable methods.

The nozzle 400 includes a central passage 416 extending through the main body 404 and into the cylinder 436. The VIG inlet 160 breaks into an end of the passage 416 disposed in the cylinder 436 to allow gas to exit the nozzle 400 into the plenum 172. The opposite end of the passage 416 includes a port 418 which accommodates a fitting 308. The fitting 308 is coupled by a conduit 310 to the gas panel 138 to allow process and other gases to be delivered through the nozzle 400 and into the plenum 172 through the VIG inlet 160.

Figure 7:
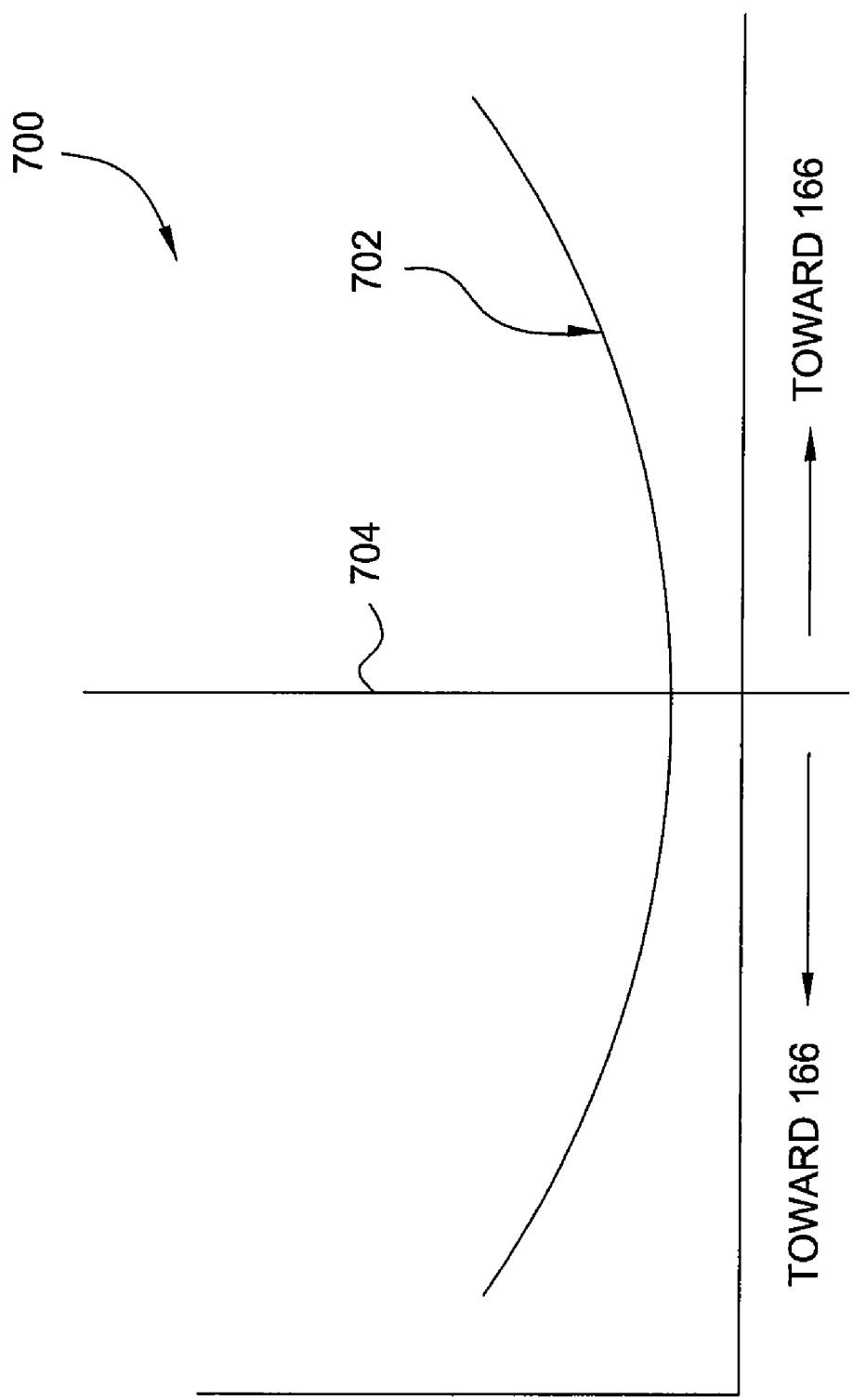
FIG. 7 is graph depicting edge to center gas flow and/or pressure uniformity.

The substantially tangential flow 418 exiting the VIG inlet 160 induces a fast moving high pressure flow 406 proximate the annular outer wall 166 of the gas distribution plate 132 due to the centrifugal force of the gases circulating within the plenum 172. As the circulating gases in the high pressure region of the plenum begin to slow, the slowing circulating gases move inward as illustrated by arrows 408. The inwardly moving gas then passes through the holes 168 formed through the gas distribution plate 132 and into the processing region 180. As the pressure of the gas within the plenum 172 decreases as it moves radially inward, the pressure and/or flow rate of the gases passing through the plenum 172 into the processing region 180 is reduced closer to the center of the gas distribution plate 132 relative to the perimeter, creating a pressure and/or flow gradient illustrated by trace 702 in the graph 700 of FIG. 7. In the embodiment of FIGS. 4-6, the pressure and/or flow at the center of the gas distribution plate 132, indicated by vertical line 704 in the graph 700, is less than the pressure proximate the annular outer wall 166 of the gas distribution plate 132. Also notably illustrated by the graph 700 is that the trace 702 is symmetrical about the vertical line 704 representing the center of the gas distribution plate 132 (which coincides with the center line 300 of the processing chamber 102 and substrate support pedestal 116), illustrating that the distribution of pressure at any given radius within the plenum 172 is substantially equal, which may eliminate, or at least substantially reduce, skew or azimuthal non-uniformities of gas flowing through the gas distribution plate 132. As edge to center processing results are more easily tuned by other process knobs within the processing chamber, the overall process uniformity and control is greatly enhanced.

Figure 8:
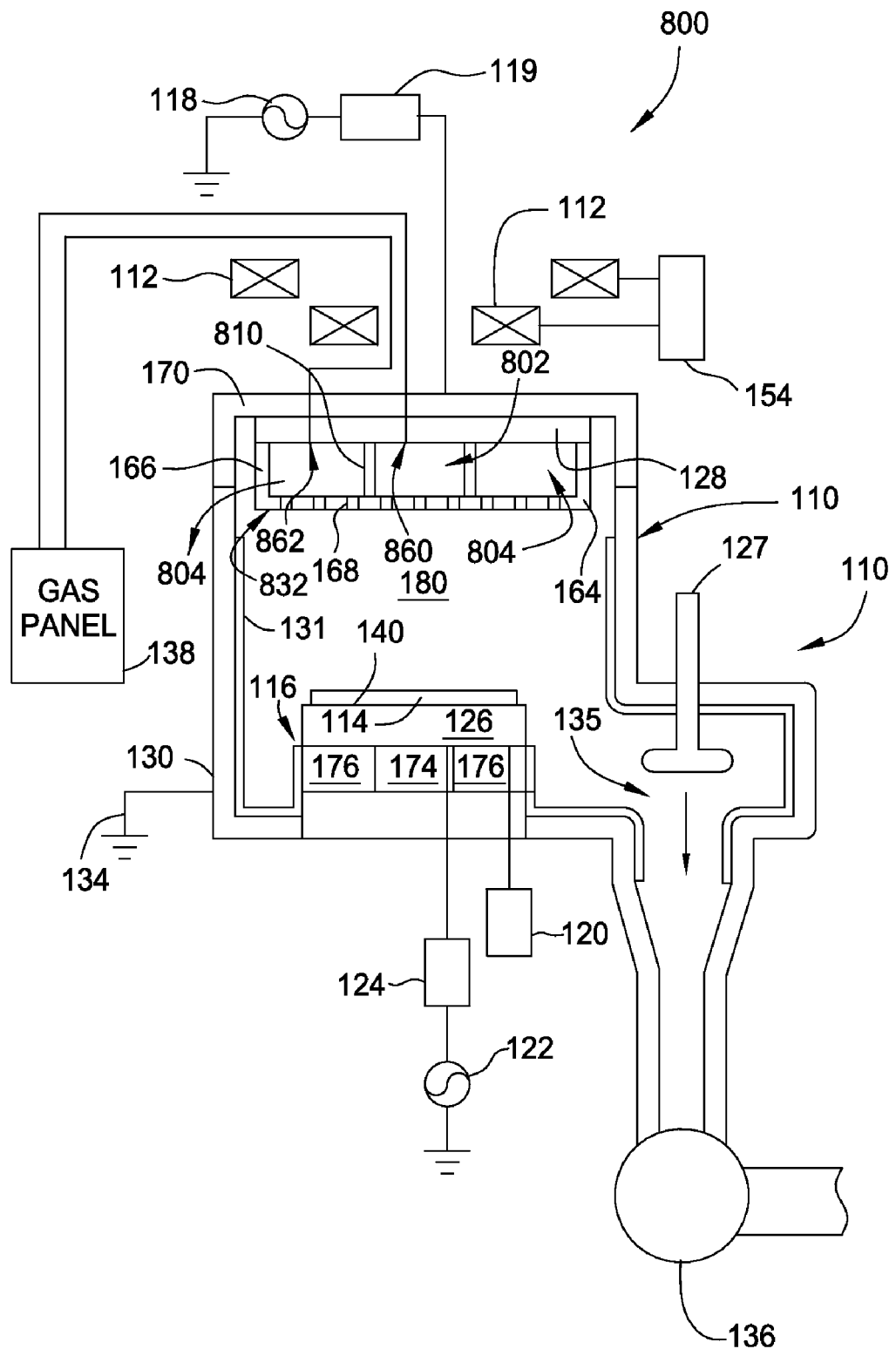
FIG. 8 is a schematic sectional view of another embodiment of a processing chamber having at least one vortex inducing gas inlet.

FIG. 8 is another embodiment of a processing chamber 800 having at least one vortex inducing gas inlet upstream of a gas distribution plate 832. The processing chamber 800 is substantially similar to the processing chamber 102 described above, except wherein the gas distribution plate 132 includes a partition 810 separating an inner plenum 802 from a circumscribing outer plenum 804. At least one of the inner or outer plenums 802, 804 is fed by a first VIG inlet to induce a vortex flow within at least one of the plenums 802, 804 as described above. In the embodiment depicted in FIG. 8, a first VIG inlet 860 is disposed through the lid 170 to induce a flow in the inner plenum 802, while a second VIG inlet 862 is disposed through the lid 170 to induce a vortex flow in the outer plenum 804. The VIG inlets 860, 862 may be configured as described above with reference to FIGS. 2-7, and as such, further description is omitted for the sake of brevity.

In any of the embodiments described herein, the proximity of the VIG inlet to the outer annular wall of the gas distribution plate enhances the formation of the vortex flow and uniform gradients within the plenum. In embodiments wherein the VIG inlet disposed through the lid is radially spaced from the outer annular wall of the gas distribution plate, an annular vortex confinement ring may be disposed in the plenum to enhance the uniformity of the pressure and/or flow profile within the plenum and exiting the gas distribution plate into the processing region of the processing chamber. The annular vortex confinement ring includes an annular confinement channel plenum aligned with the VIG inlet in which the vortex flow of gas is confined. A plurality of holes are formed through the annular vortex confinement ring and break into the annular confinement channel plenum. Gas passes from the annular confinement channel plenum through the holes and into the plenum. Holes in the annular vortex confinement ring disposed at a common bolt circle or radius provide gas into the plenum at a uniform pressure and/or flow rate. Since gas is uniformly distributed into the plenum from the annular vortex confinement ring, a radial pressure and/or flow gradient may be generated within the plenum resulting in a radial pressure and/or flow gradient of gases exiting the gas distribution plate and into the processing region of the processing chamber.

Figure 9:
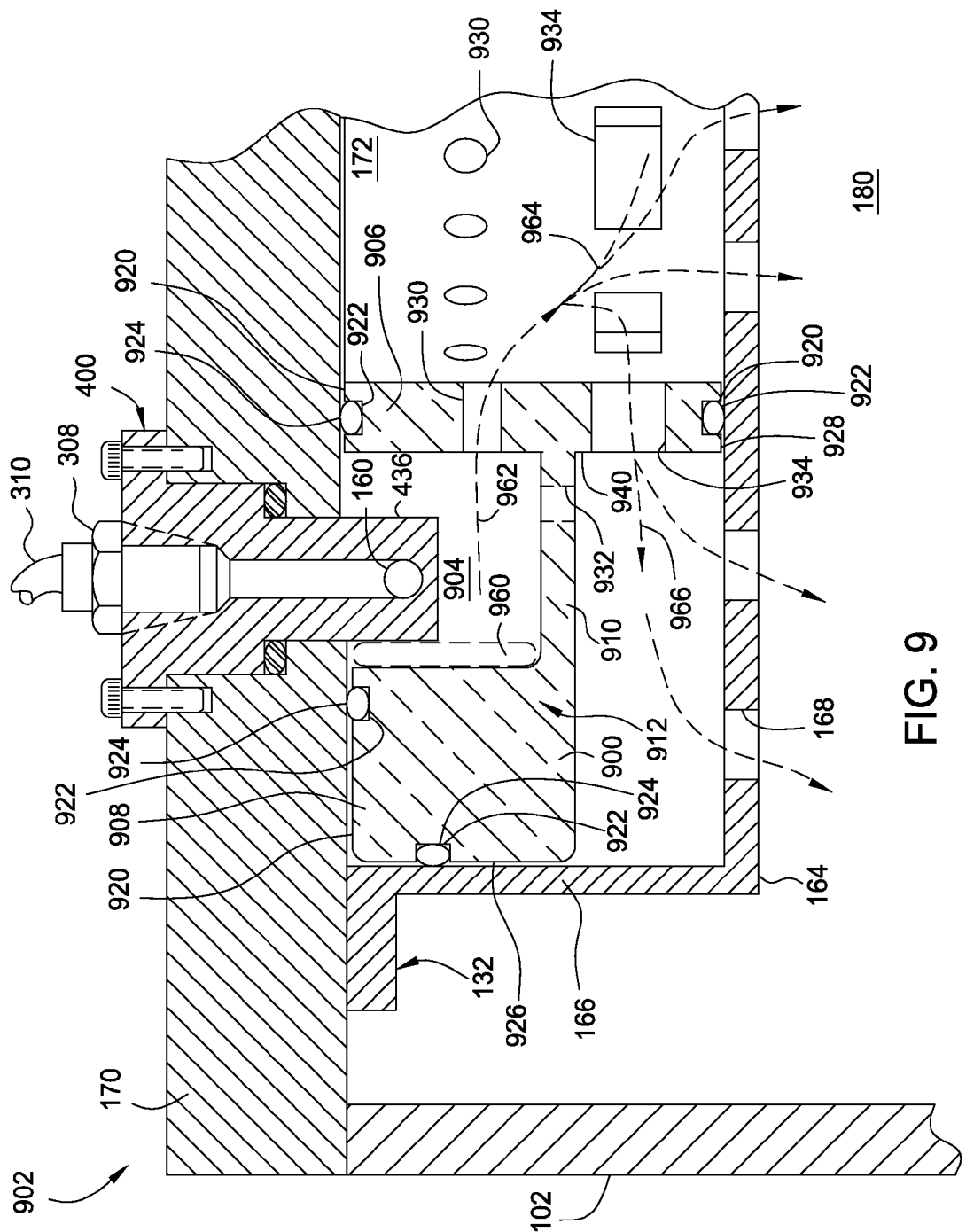
FIG. 9 is one embodiment of a vortex confinement ring.
Figure 10:
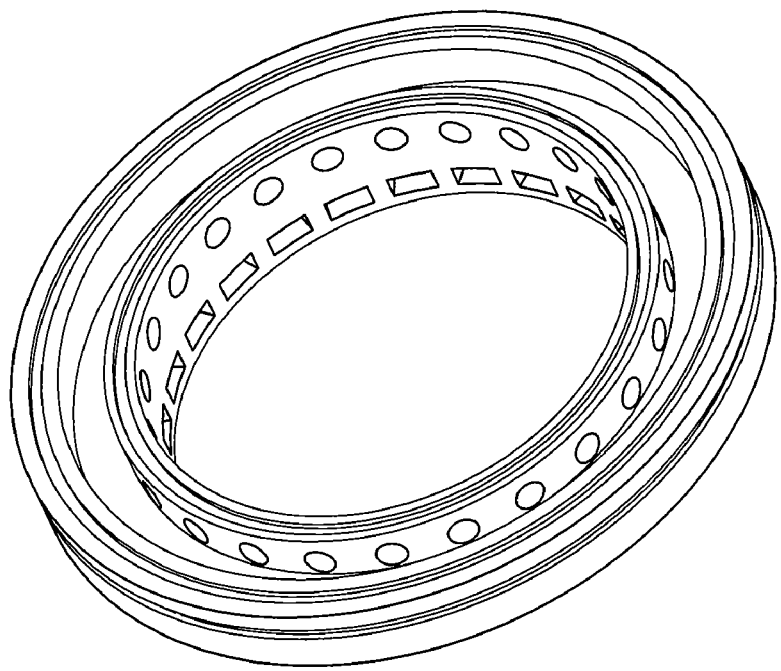
FIGS. 10-11 are top and bottom isometric views of the vortex confinement ring of FIG. 9.
Figure 11:
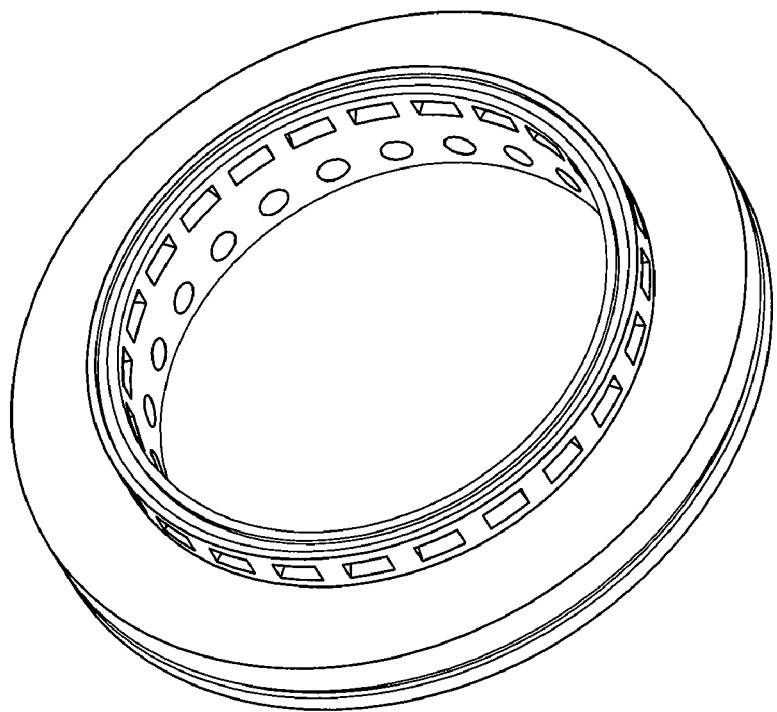

FIG. 9 is a partial sectional view of one embodiment of an annular vortex confinement ring 900 interfaced with a VIG inlet 160 formed and/or disposed in a lid 170 of a processing chamber 902. The processing chamber 902 may be configured as the processing chambers 102, 800 depicted above, or as another suitable processing chamber. FIGS. 10-11 are also provided to illustrate isometric top and bottom views of the annular vortex confinement ring 900. It is understood that the annular vortex confinement ring 900 may be utilized in embodiments of processing chambers having a single plenum such as illustrated in FIGS. 1-6, or multiple plenums, for example, the processing chamber 800 as illustrated in FIG. 8. It is also contemplated that the annular vortex confinement ring 900 may be utilized on only one, some or all plenums of a processing chamber, for example, at least one of the plenums 802, 804 of the processing chamber 800 as illustrated in FIG. 8.

The annular vortex confinement ring 900 includes an annular main body 912 having an annular confinement channel plenum 904 formed in an upper surface 920 of the main body 912. The annular confinement channel plenum 904 is aligned with the VIG inlet 160 such that gases exiting the VIG inlet 160 create a vortex flow within the channel plenum 904.

The main body 912 includes an inner wall 906, an outer wall 908 and a bottom 910 that bound the confinement channel plenum 904. An optional lip 940 may extend from the bottom 910 of the main body 912 to maintain the main body 912 spaced from the face plate 164 of the gas distribution plate 132. The upper surface 920 of the inner wall 906 and outer wall 908, an outer surface 926 of the outer wall 908 and a bottom surface 928 of the lip 940 may include o-ring grooves 922 that accommodate o-rings 924 to prevent particle generation due to touching of the vortex confinement ring 900 and the lid 170 and/or gas distribution plate 132.

The main body 912 includes a plurality of holes 930 formed through the inner wall 906 that break into the confinement channel plenum 904. The holes 930, formed on a common radius or bolt circle, allow gas within the confinement channel plenum 904 to flow into the plenum 172. Optionally, holes 932 (shown in phantom) may be provided through the bottom 910 on a common radius or bolt circle of the main body 912 to allow gas to flow from the confinement channel plenum 904 into a region of the plenum 172 below the vortex confinement ring 900. The lip 940 also includes a plurality of passages or grooves, shown in FIG. 9 as slots 934, which allow gases from the inner region of the plenum 172 to flow into the region of the plenum 172 below the vortex confinement ring 900.

In operation, gas is provided into the confinement channel plenum 904 from the gas panel 138 through the VIG inlet 160. The orientation of the VIG inlet 160 induces a vortex flow of gases within the confinement channel plenum 904. The gases circulating in the confinement channel plenum 904 form a high velocity, high pressure region (as indicated by reference numeral 960) proximate the outer wall 908. As the gas in the high pressure region 960 slows, the gas moves radially inward (as indicated by reference numeral 962). The radially inward moving flow 962 exits the confinement channel plenum 904 through the holes 930 (and/or holes 932) and enters the plenum 172. As described above, the circulating flow within the confinement channel plenum 904 azimuthally equalizes the pressure and/or flow rate such that the pressure and/or flow rate entering the plenum 172 from a passage of the vortex confinement ring 900 disposed the same distance from the center line 300 of the processing chamber 902 are substantially uniform in pressure and/or flow.

Since the flow entering the plenum 172 from the vortex confinement ring 900 is not proximate the outer wall 166 of the gas distribution plate, some of the gas moves radially inward as indicated by arrow 964 through the holes 168 into the processing region 180, while some of the gas moves radially outward as indicated by arrow 966 through the slots 934 to the region below the vortex confinement ring 900 prior to passing through the holes 168 of the gas distribution plate 132 and into the processing region 180. The inward and outward distribution of gases within the plenum, while still maintaining a common pressure at a given radius, causes a complex profile of radial pressure distribution within the plenum 172 while still eliminating skew or azimuthal non-uniformity. In the embodiment depicted in FIG. 9, the highest flow and/or pressure is proximate the lip 910, and decreasing both inward and outward therefrom.

Figure 12:
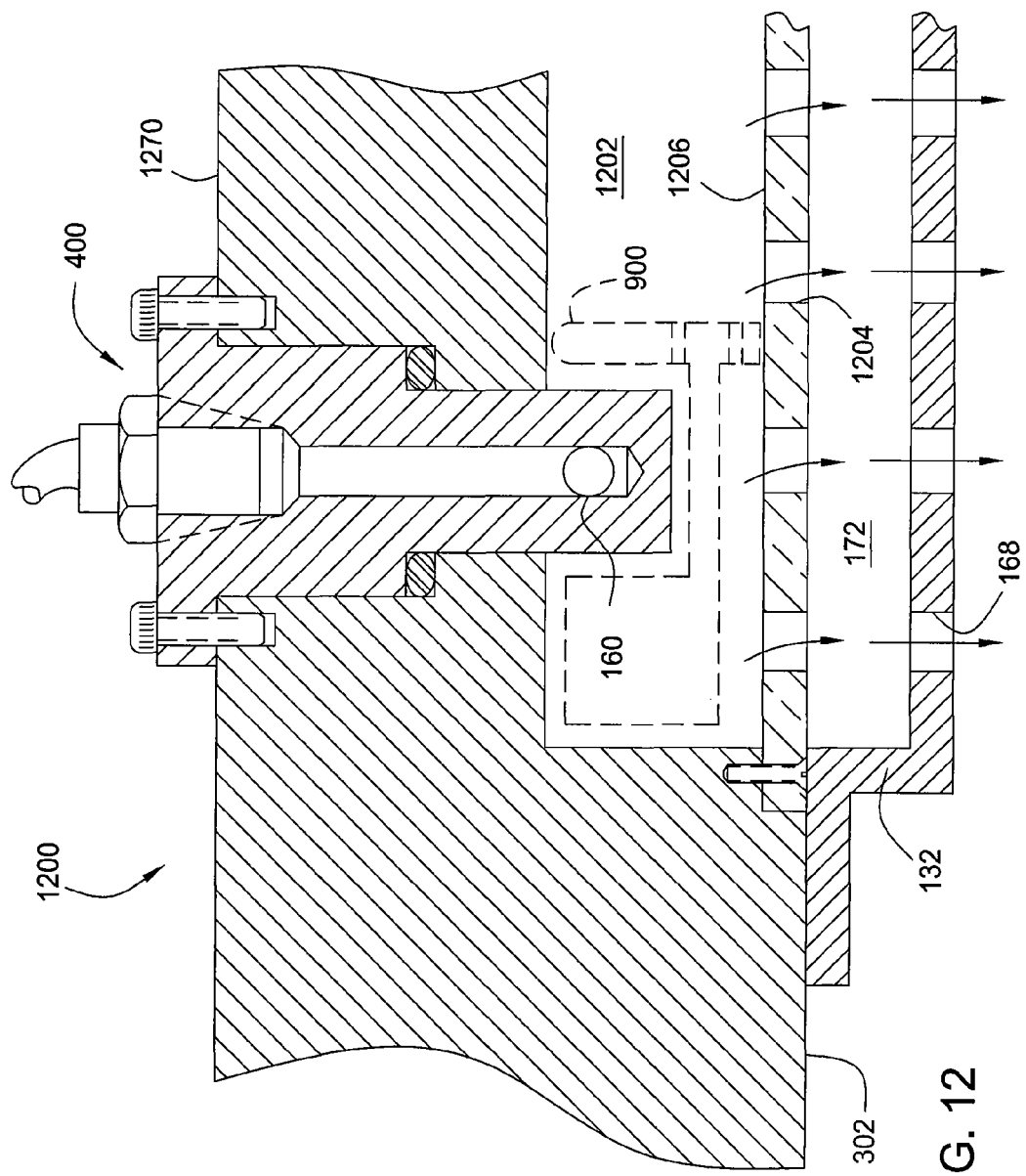
FIG. 12 is a schematic sectional view of another embodiment of a processing chamber having at least one vortex inducing gas inlet for inducing a vortex within a lid of the processing chamber.

FIG. 12 is a partial sectional view of another embodiment of a processing chamber 1200. The non-illustrated portions of the processing chamber 1200 are as described for processing chambers 102, 800, 902 as described above. The processing chamber 1200 includes a cylindrical internal lid plenum 1202 formed in a lid 1270. The VIG inlet 160 is disposed in the lid 1270 as to induce a vortex flow within the internal lid plenum 1202. Optionally, a vortex confinement ring 900 (shown in phantom) may also be utilized in the internal lid plenum 1202. The internal lid plenum 1202 is enclosed by a lid cap 1206. A plurality of holes 1204 are formed through the lid cap 1206 to enable gases within the internal lid plenum 1202 to enter a plenum 172 defined between a gas distribution plate 132 and the lid 1270. The vortex flow inducted in the internal lid plenum 1202 results in the flow of gases entering the plenum 172 to be substantially free of skew or azimuthal non-uniformities due to a radial pressure gradient present within the plenum 1202.

Thus, the invention provides a means for providing a radial pressure gradient and/or radial flow gradient of gases exiting a gas distribution plate into a processing region of a processing chamber. The radial gradient is formed by a vortex flow circulating around the center line of the processing chamber induced prior to the gases passing through the gas distribution plate. As radial asymmetries are more easily tuned utilizing other process control knobs, the overall control of processing results is greatly enhanced.

While the foregoing is directed to some embodiments of the present invention, other and further embodiments of the invention may be devised without departing from the basic scope thereof, and the scope thereof is determined by the claims that follow.

What is claimed is:

1. A vacuum processing chamber, comprising:
   a chamber body having an interior volume;
   a substrate support pedestal disposed in the interior volume;
   a lid enclosing the interior volume;
   a gas distribution plate positioned below the lid and above the substrate support pedestal;
   a vortex inducing gas inlet oriented to induce a vortex of gas circulating in a plenum around a center line of the chamber body prior to the gas passing through the gas distribution plate; and
   a vortex confinement ring disposed in the plenum and having a channel plenum aligned with and accepting gas from the vortex inducing gas inlet, wherein the vortex confinement ring further comprises a main body having the channel plenum formed therein, the main body having an inner wall bounding the channel plenum, the inner wall having a plurality of holes allowing fluid communication between the channel plenum and the plenum defined between the gas distribution plate and the lid.

2. The vacuum processing chamber of claim 1, wherein the lid further comprises:
   a plurality of holes disposed on a common bolt circle fluidly coupling the plenum in the lid and the plenum defined between the gas distribution plate and the lid.

3. The vacuum processing chamber of claim 1, wherein the plenum is defined between the gas distribution plate and the lid.

4. The vacuum processing chamber of claim 3, wherein the vortex inducing gas inlet is embodied in a nozzle having an orientation substantially tangential to a radius originating from the center line of the chamber body.

5. The vacuum processing chamber of claim 4, wherein the plenum is disposed in the vortex confinement ring, wherein the vortex confinement ring is disposed between the gas distribution plate and the lid.

6. The vacuum processing chamber of claim 5, wherein the vortex confinement ring further comprises:
   a plurality of holes disposed on a common bolt circle fluidly coupling the plenum in the vortex confinement ring and a plenum defined between the gas distribution plate and the lid.

7. The vacuum processing chamber of claim 1, wherein the gas distribution plate comprises at least two concentric and fluidly isolated plenums, one of the fluidly isolated plenums being the plenum in which the vortex inducing gas inlet is interfaced.

8. The vacuum processing chamber of claim 7, wherein the vortex confinement ring disposed in at least one of the fluidly isolated plenums.

9. A vacuum processing chamber, comprising:
   a chamber body having an interior volume;
   a substrate support pedestal disposed in the interior volume;
   a lid enclosing the interior volume;
   a gas distribution plate positioned below the lid and above the substrate support pedestal;
   a plenum defined between the gas distribution plate and the lid;
   a vortex inducing gas inlet oriented to induce a vortex of gas circulating in the plenum prior to the gas passing through the gas distribution plate; and
   a vortex confinement ring disposed in the plenum and having a channel plenum aligned with and accepting gas from the vortex inducing gas inlet, wherein the vortex confinement ring further comprises a main body having the channel plenum formed therein, the main body having an inner wall bounding the channel plenum, the inner wall having a plurality of holes allowing fluid communication between the channel plenum and the plenum defined between the gas distribution plate and the lid.

10. The vacuum processing chamber of claim 9, wherein the vortex confinement ring further comprises:
    a lip extending from the main body and maintaining the main body in a spaced-apart relation relative to the gas distribution plate, the lip comprising a plurality of passages or grooves allowing flow to pass through the lip.

11. The vacuum processing chamber of claim 9, wherein the gas distribution plate further comprises:
    a partition defining a second plenum between the lid and the gas distribution plate, the second plenum fluidly communicating with a second gas inlet formed in the lid and the interior volume of the processing chamber.

12. The vacuum processing chamber of claim 9 further comprising:
    a vortex confinement ring disposed in the plenum and having a channel plenum aligned with and accepting gas from the vortex inducing gas inlet.

* * * * *